United States Patent
Whittington (10) Patent No.: US 11,408,916 B2
(45) Date of Patent: Aug. 9, 2022

(54) MODULAR PROBE FOR AUTOMATED TEST APPLICATIONS

(71) Applicant: NATIONAL INSTRUMENTS CORPORATION, Austin, TX (US)

(72) Inventor: Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 150 days.

(21) Appl. No.: 16/811,455

(22) Filed: Mar. 6, 2020

(65) Prior Publication Data

US 2020/0284822 A1     Sep. 10, 2020

Related U.S. Application Data

(60) Provisional application No. 62/815,803, filed on Mar. 8, 2019.

(51) Int. Cl.
| | | |
|---|---|---|
| *G01R 1/067* | (2006.01) | |
| *G01R 13/20* | (2006.01) | |
| *G01R 1/073* | (2006.01) | |

(52) U.S. Cl.
CPC ......... *G01R 1/06788* (2013.01); *G01R 13/20* (2013.01); *G01R 1/073* (2013.01)

(58) Field of Classification Search
CPC ..... G01R 1/073; G01R 1/06788; G01R 13/20
See application file for complete search history.

(56) References Cited

U.S. PATENT DOCUMENTS

| | | | |
|---|---|---|---|
| 4,209,742 A | 6/1980 | Bender et al. | |
| 6,734,689 B1 * | 5/2004 | Yang | G01R 1/06772 324/755.02 |
| 2004/0239334 A1 * | 12/2004 | Kreager | H01R 24/542 324/538 |
| 2009/0025243 A1 | 1/2009 | Prestidge et al. | |
| 2010/0277195 A1 | 11/2010 | Daoudi et al. | |

(Continued)

OTHER PUBLICATIONS

"ABCs of Probes, Primer", Tektronix, Mar. 2013, 60 pages, http://web.mit.edu/6.101/www/reference/ABCprobes_s.pdf [Retrieved Oct. 29, 2020].

*Primary Examiner* — Paresh Patel
(74) *Attorney, Agent, or Firm* — Kowert, Hood, Munyon, Rankin & Goetzel, P.C.; Jeffrey C. Hood (57) ABSTRACT

A novel modular probe may include an interchangeable (connectable/disconnectable) probe-tip adaptor having a tip connector for coupling to a device under test, and further having a probe-tip terminal for coupling to a first assembly connector of a cable assembly, which further has a second assembly connector for coupling to a first build-out terminal of a build-out adaptor, which also has a second build-out terminal for coupling to an assembly connector of an interchangeable instrument connector cable assembly, which also has an instrument-end connector for coupling to a measurement instrument. The built-out adaptor may include a compensation adjustment circuit for compensating the probe for varying system capacitances. The probe may include one or more corrective circuits in the interchangeable probe-tip adaptor and/or in the build-out adaptor for at least partially terminating each end of the cable assembly with a characteristic impedance of the cable in the cable assembly to attenuate reflections.

20 Claims, 4 Drawing Sheets

(56) References Cited

U.S. PATENT DOCUMENTS

| | | | |
|---|---|---|---|
| 2011/0074391 A1* | 3/2011 | Bartlett | G01R 1/06766 |
| | | | 324/76.44 |
| 2011/0074392 A1* | 3/2011 | Bartlett | G01R 1/06766 |
| | | | 324/76.44 |
| 2014/0053667 A1 | 2/2014 | Spinar et al. | |
| 2015/0247632 A1 | 9/2015 | McGilvray | |
| 2015/0304864 A1* | 10/2015 | Olgaard | H04B 17/15 |
| | | | 370/251 |
| 2017/0055948 A1 | 3/2017 | Peterson et al. | |
| 2017/0188827 A1 | 7/2017 | Yamanaka | |

* cited by examiner

FIG. 4 ent systems, e.g. DAQ devices as noted above, may also include oscilloscopes and/or other types of signal analyzers, signal generators, function analyzers, etc.

MODULAR PROBE FOR AUTOMATED TEST APPLICATIONS

PRIORITY CLAIM

This application claims benefit of priority of U.S. Provisional Patent Application Ser. No. 62/815,803 titled "Modular Probe for Automated Test Applications", filed on Mar. 8, 2019, which is hereby incorporated by reference as though fully and completely set forth herein.

BACKGROUND OF THE INVENTION

Field of the Invention

This invention relates generally to measurement and data acquisition systems and, more particularly, to probes (e.g. passive probes) for automated test applications.

Description of the Related Art

Measurement systems are oftentimes used to perform a variety of functions, including measurement of physical phenomena, measurement of certain characteristics or operating parameters of a unit under test (UUT) or device under test (DUT), testing and analysis of physical phenomena, process monitoring and control, control of mechanical or electrical machinery, data logging, laboratory research, and analytical chemistry, to name a few examples.

A typical contemporary measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a USB (Universal Serial Bus), a GPM (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT or for influencing the system being controlled. These measurement systems, which can be generally referred to as data acquisition systems (DAQs), are primarily used for converting a physical phenomenon (such as temperature or pressure) into an electrical signal and measuring the signal in order to extract information. PC-based measurement and DAQs and plug-in boards are used in a wide range of applications in the laboratory, in the field, and on the manufacturing plant floor, among others.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and receive digital signals to implement one or more digital I/O applications. DAQ devices may also include Source-Measure Units (SMUs), which may apply a voltage to a DUT and measure the resulting current, or may apply a current to the DUT and measure the resulting voltage. Measurement systems, e.g. DAQ devices as noted above, may also include oscilloscopes and/or other types of signal analyzers, signal generators, function analyzers, etc.

Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT or to influence the system being controlled.

One example of a type of widely used measurement/test instrument is the oscilloscope. Measurement/test instruments such as oscilloscopes may be used with what are referred to as "active probes", which receive power and transmit signal to the host instrument (e.g. oscilloscope) through separate conductors in the interconnecting cable, and may also be used with "passive probes", which do not include active components such as transistors or amplifiers and therefore do not need to be powered. In general, connector types, cable length, size, cost, and temperature may affect the ease of probe connectivity to the measurement/test instruments, and the accuracy of the measurements obtained from those instruments.

Other corresponding issues related to the prior art will become apparent to one skilled in the art after comparing such prior art with the present invention as described herein.

SUMMARY OF THE INVENTION

In various embodiments, many disadvantages associated with present day probes, e.g. associated with passive probes used with measurement or test instruments, e.g. with oscilloscopes, may be overcome through a modular probe design in which specific designated assembly connectors, e.g. coaxial connectors, may be located between a probe-tip adaptor and a cable assembly, and between the cable assembly and a build-out adaptor, which allows for the use of a variety of different (e.g. standard) connectors, and provides a wide range of compensation (corresponding to a wide range of shunt capacitance) to accommodate the different capacitances of varying cable lengths. The modular probe may also include one or more compensation networks, e.g. RC (resistive-capacitive) networks in both the probe-tip adaptor and the build-out adaptor to partially terminate each end of the cable with the cable's characteristic impedance, which helps attenuate reflections.

Pursuant to the above, a modular probe may include a disconnectable (interchangeable) probe-tip adaptor having a tip connector at one end for coupling to a device under test, and further having an assembly terminal at the other end. The modular probe may further include a disconnectable (interchangeable) cable assembly having a first assembly connector at one end of a cable and further having a second assembly connector at the other end of the cable, with the first assembly connector coupled to the assembly terminal. The modular probe may additionally include a disconnectable (interchangeable) build-out adaptor having a first build-out terminal at one end and further having a second build-out terminal at the other end, with the build-out terminal coupled to the second assembly connector. Finally, the modular probe may include a disconnectable (interchangeable) instrument connector cable assembly having a third assembly connector at one end and further having an instrument-end connector at the other end, with the third assembly connector coupled to the second build-out terminal and the instrument-end connector used for coupling the modular probe to a measurement instrument.

The disconnectable built-out adaptor may include a compensation adjustment control circuit for accommodating different capacitances of varying lengths of the cable, and for further accommodating different input capacitances of the different measurement instruments that may be coupled to the instrument-end connector. The modular probe may also include one or more corrective circuits included in the disconnectable probe-tip adaptor and/or in the build-out adaptor for at least partially terminating each end of the cable with a characteristic impedance of the cable to attenuate reflections in the cable assembly. The cable used in the disconnectable cable assembly may be general purpose use coaxial cable, thereby not requiring specialized high-loss type cables typically used in conventional probes. Similarly, the first assembly connector, the second assembly connector, and/or the third assembly connector may all be coaxial connectors. In some embodiments, the tip connector may be a standard coaxial connector, such as a subminiature version B (SMB) connector, thereby not requiring a customized tip unlike conventional hand-held probes.

The disconnectable probe-tip adaptor may be connectively replaceable by a different probe-tip adaptor having a different attenuation level than the probe-tip adaptor presently connected in the modular probe. For example, the current probe-tip adaptor may be disconnected from the modular probe and a probe-tip adaptor having a different attenuation level may be connected into the modular probe. In this manner, probe-tip adaptors with different attenuation levels (for example 10:1 and 100:1) may be conveniently interchanged without requiring replacement of the entire probe assembly. Furthermore, the disconnectable instrument connector cable assembly may be connectively replaceable by a different instrument connector cable assembly having a respective instrument-end connector compatible with a corresponding input terminal of the measurement instrument in case the instrument-end connector of the disconnectable instrument connector cable assembly is not compatible with the corresponding input terminal of the measurement instrument.

A measurement system for performing measurements on a device under test may thus include a device under test and a measurement instrument that may perform measurement on the device under test. The device under test may be coupled to the measurement instrument using a modular probe as described above, providing great flexibility in connecting/coupling different devices under test to different measurement instruments without sacrificing measurement accuracy. In some embodiments, the measurement system may include multiple devices under test and/or multiple test points on one or more devices under test coupled to a single a measurement instrument via a multiplexer which may selectively couple any one of multiple modular probes to the measurement instrument at any given time. In such embodiments, each modular probe may correspond to a different respective device under test or to a different respective test point of a device under test. Thus, each modular probe may have a disconnectable probe-tip adaptor having a tip connector at one end and further having an assembly terminal at the other end, with the disconnectable probe-tip adaptor coupled to the respective device under test or respective test point corresponding to the modular probe. Each modular probe may have a disconnectable instrument connector cable assembly having an instrument-end connector coupled to a corresponding respective input terminal of the multiplexer.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE EMBODIMENTS

Embodiments of the present invention may be used in systems configured to perform test and/or measurement functions, to control and/or model instrumentation or industrial automation hardware, or to model and simulate functions, e.g., modeling or simulating a device or product being developed or tested, etc. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications, including the control of other types of devices such as multimedia devices, video devices, audio devices, telephony devices, Internet devices, etc.

Figure 1:
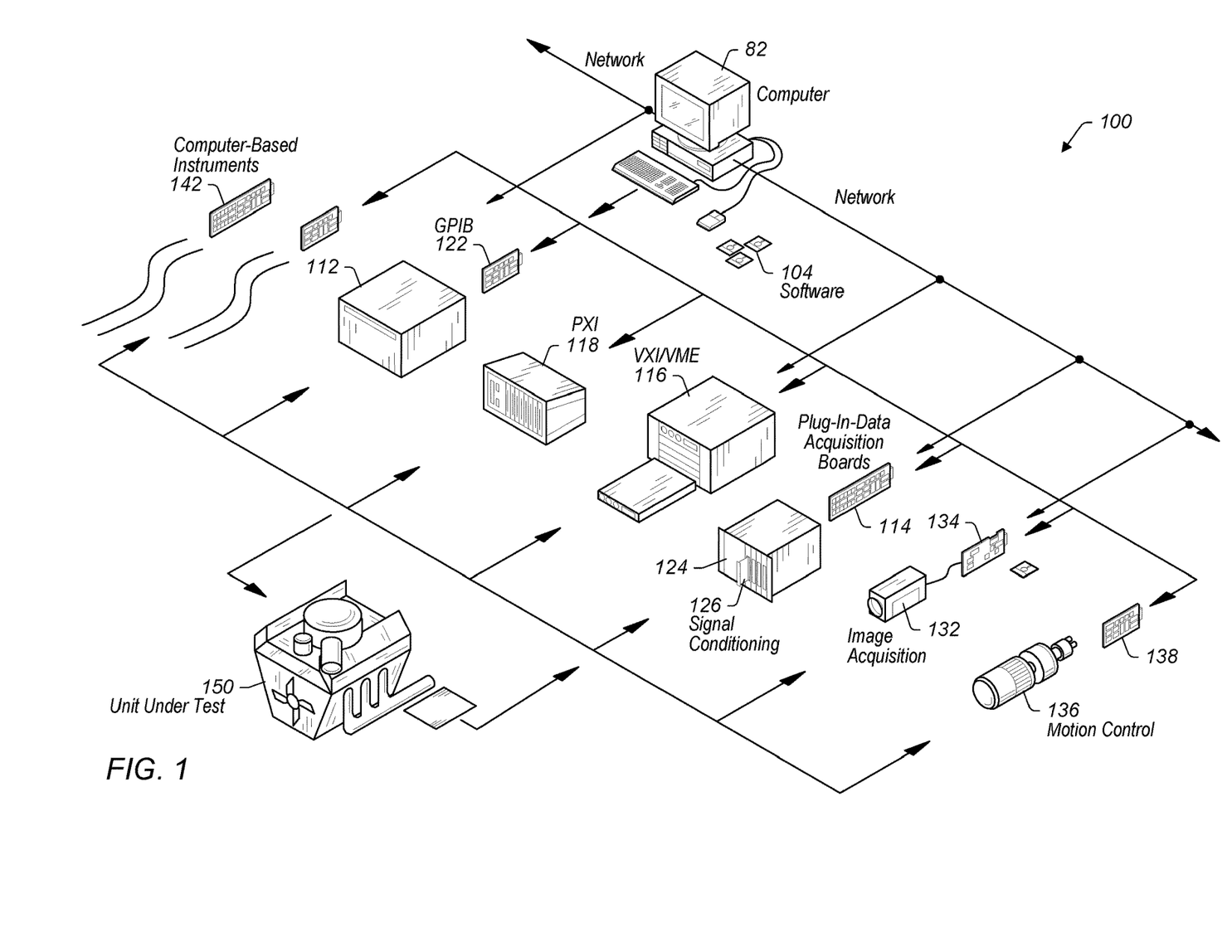
FIG. 1 shows an exemplary instrumentation control system with instruments networked together according to one set of embodiments.

FIG. 1 illustrates an exemplary instrumentation control system 100 which may be configured according to embodiments of the present invention. System 100 comprises a host computer 82 which may couple to one or more instruments configured to perform a variety of functions using a modular probe, implemented according to various embodiments. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
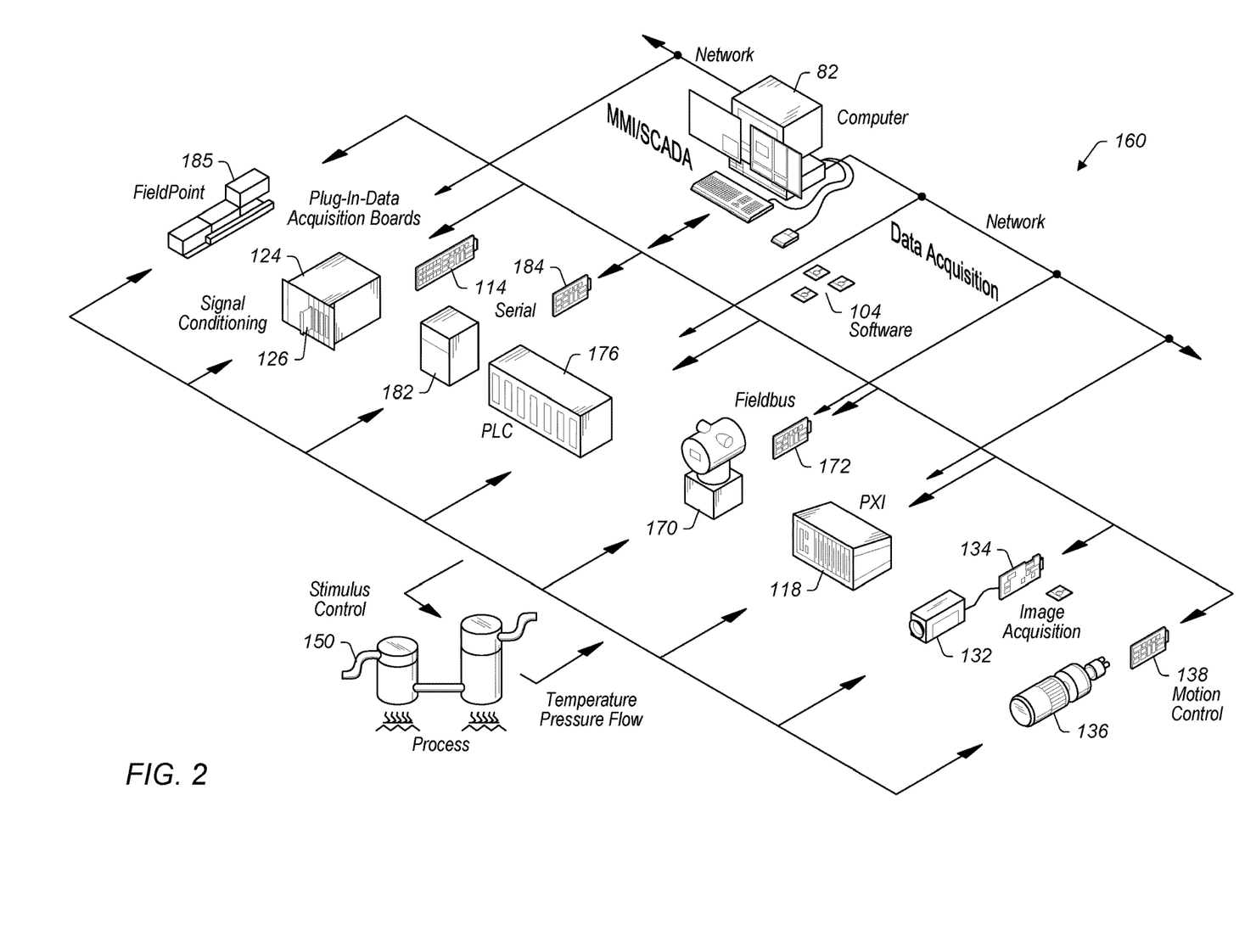
FIG. 2 shows an exemplary industrial automation system with instruments networked together according to one set of embodiments.

FIG. 2 illustrates an exemplary industrial automation system 160 that may be configured according to embodiments of the present invention. Industrial automation system 160 may be similar to instrumentation or test and measurement system 100 shown in FIG. 1. Elements that are similar or identical to elements in FIG. 1 have the same reference numerals for convenience. System 160 may comprise a computer 82 which may couple to one or more devices and/or instruments configured to use a modular probe as disclosed herein, according to various embodiments. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection, which may facilitate running a high-level synchronization protocol between the computer system and the coupled instruments/devices.

In one set of embodiments, any one or more of the instruments and/or the various connectivity interfaces of computer 82 (coupling computer 82 to the one or more devices) may connect to any one or more of the instruments and/or connectivity interfaces of computer 82 using a modular probe, as will be further described in detail below. Generally, various embodiments disclosed herein facilitate an instrument, for example an instrument configured in an automated test system, to be used with modular probes without requiring specialized probes and/or connector systems, and further without many of the disadvantages associated with present day probes.

While various embodiments are described herein in greater detail with respect to an oscilloscope, the connectivity/connection technology described herein may equally be used with, and/or applied to many other test instruments, such as a function generator or digital test equipment (i.e. semiconductor test equipment), just to name a couple. In various embodiments, a novel modular probe may be used to couple a variety of different devices (under test) to a variety of different instruments, thereby obviating the need for specialized probes required for each device and/or instrument.

Figure 3:
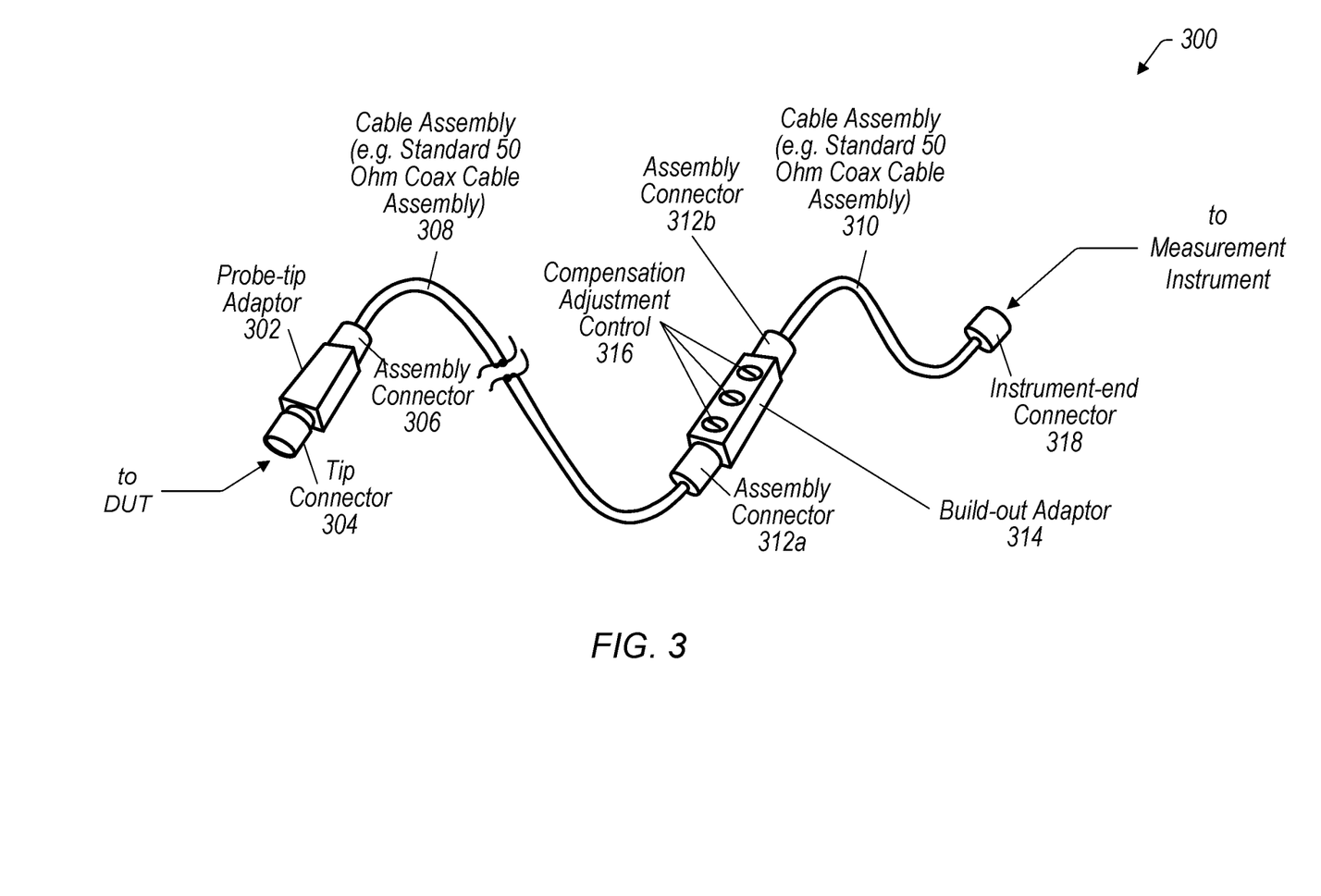
FIG. 3 shows a simplified diagram illustrating an exemplary modular probe according to some embodiments.

FIG. 3 shows a simplified diagram illustrating an exemplary modular probe 300 according to some embodiments. As shown in FIG. 3, the basic design may emulate that of a typical attenuating (typically 10:1) probe (e.g. passive oscilloscope probe) in that it includes a probing tip, an interconnecting cable, and a means of compensating the probe for varying system capacitances. There are several important differences between probe 300 and a standard probe, however, making probe 300 well suited for automated test applications. Some of the differences will now be discussed, including the advantages they provide over conventional (passive) probes in use today.

Probe 300 is a modular probe including a probe-tip adaptor 302, a main cable assembly 308 and an instrument-end cable assembly 310, and a build-out adapter 314. Probe 300 may also include a compensation circuit, with compensation adjustment control 316 located in build-out adaptor 314. An assembly connector (e.g. coaxial connector) 306 may connect/couple the probe-tip adaptor 302 to the cable assembly (e.g. coaxial cable assembly) 308, assembly connector 312a may connect/couple the cable assembly 308 to build-out adaptor 314, assembly connector 312b may couple build-out adaptor 314 to instrument-end cable assembly 310. The probe tip connector 304 may couple the modular probe 300 to a device under test or to a specific test point among multiple test points on a device under test, while instrument-end connector 318 may couple the modular probe to a measurement instrument. Conventional probes are typically built in one piece with no interconnects. The interconnecting cable assembly 308 may be the type commonly found in test labs for general purpose use and may include standard and/or non-specialized coaxial cable. Examples include RG-174, RG-58, and RG-316. In contrast, the coaxial cable used in conventional probes is a specialized high-loss type cable that is usually not detachable from the probe-tip, unlike the configuration of probe 300.

The probe 300 may connect to the device under test (DUT) using a standard tip connector 304, e.g. a coaxial connector such as SMB, through the probe-tip adapter. It should be noted that connection(s) to a DUT may also be interpreted as connection(s) to a specific test point on a DUT, as there may be cases in which possibly only one device is tested, but that device may have (include) multiple test points to be probed, and a different respective probe may be used for (coupled to) each of those test points. As is well known to one of ordinary skill in the art, an SMB (Submin-iature version B) connector is a coaxial radio frequency (RF) connector which is smaller than an SMA (Subminiature version A) connector, which is a semi-precision coaxial RF connector for coaxial cable with a screw-type coupling mechanism. The SMA connector typically has a 50Ω imped-ance and is designed for use from DC (0 Hz) to 18 GHz, and is most commonly used in microwave systems, hand-held radio and mobile telephone antennas, and more recently with Wi-Fi antenna systems. As opposed to the interchange-able probe-tip adaptor 302, conventional hand-held probes have a unique customized tip for connecting to the probe manufacturer's accessories and are therefore incompatible with common connector types.

The build-out adaptor 314 may allow a wide range of compensation (corresponding to a wide range of shunt capacitance) to accommodate the different corresponding capacitances of different (varying) lengths of the cable in cable assembly 308. This may be in addition to any neces-sary range(s) to accommodate the different input capaci-tances of different measurement instrument connections, e.g. the connections of oscilloscopes. A conventional scope probe may need to compensate only for the latter as the cable distance is fixed and the range of compensation is thus much lower. Furthermore, conventional scope probes use special-ized high-loss coaxial cable to suppress reflections. In con-trast, various embodiments of probe 300 may function with common low-loss coaxial cable (in cable assembly 308), and may use a different method to suppress reflections. In some embodiments, in order to suppress reflections, corrective networks or corrective circuits, e.g. resistive-capacitive (RC) networks may be included in both the probe-tip adaptor 302 and the build-out adaptor 314, which partially terminate each end of the cable in the cable assembly with the cable's characteristic impedance, thus attenuating reflec-tions.

Based at least on the above discussed features, various embodiments of probe 300 offer many advantages over conventional scope probes for automated test applications. For example, the probe tip may be conveniently and securely fastened to the DUT or test fixture using common inexpen-sive connectors. Connection/disconnection from the test fixture also becomes easier. Test points may be located much closer to one another if a push-on type connector, such as SMB for example, is used. The cable length need not be fixed since the build-out adaptor may compensate for vary-ing cable lengths. From a system perspective, probe-tip adaptors with different attenuation levels (for example 10:1 and 100:1) may be conveniently interchanged without requiring replacement of an entire probe assembly. Effec-tively, cable assemblies 308 and 310 are disconnectable from the probe-tip adaptor 302 and build-out adaptor 314, and may be replaced by more appropriate cable assemblies as required, making modular probe 300 customizable to various different DUTs and measurement instruments.

Conventional scope probes use a BNC connector for connecting to an oscilloscope. As is well known to one of ordinary skill in the art, the BNC (Bayonet Neill-Concel-man) connector is a miniature quick connect/disconnect radio frequency connector used for coaxial cable, featuring two bayonet lugs on the female connector, with full con-nection achieved through a quarter turn of the coupling nut. BNC connectors are used with miniature-to-subminiature coaxial cable in radio, television, and other radio-frequency electronic equipment, test instruments, and video signals, and are typically made to match the characteristic imped-ance of cable at either 50 ohms or 75 ohms, and are usually applied for frequencies below 4 GHz and voltages below 500 volts. However, BNC connectors are too large to permit more than four input channels on the front panel of many measurement modules, such as PXI modules. As an example, the eight-input PXI oscilloscopes NI-5105 and NI-5172 offered by National Instruments avoid this problem by using the much smaller SMB connector. Because various embodiments of probe 300 use a short cable between a build-out adaptor and the instrument (e.g. oscilloscope) input, the accommodation of a different connector type, such as SMB, is easily accomplished by simply choosing a cable having the matching instrument-end (e.g. scope-end) con-nector, and swapping out the current cable for that cable by connecting the replacement cable to the build-out adaptor.

Access to the compensation adjustments becomes much easier with the build-out adaptor 314 located several inches away from a measurement instrument (e.g. a PXI module), facilitated by the short cable between the build-out adaptor 314 and the instrument. A conventional probe typically has the adjustor located in the same housing as the BNC plug that attaches to the measurement instrument (e.g. oscillo-scope), which is very a difficult location to access on a crowded instrument front panel such as a PXI front panel. Furthermore, conventional probes are intended to be hand-held and therefore have a rigid tip at least four inches in length. The tip-adaptor 302 of probe 300 does not have this requirement and may easily be shortened to below one inch. Such an advantage is even more pronounced where height restrictions exist. In addition, the ergonomic and aesthetic requirements of a hand-held probe need not apply to a probe intended for automated test, thus reducing both design and production costs. For example, no injection molded plastic parts may need to be used, which not only reduces overall cost but also allows operation at much higher temperatures.

Since the only expectation of the signal path between the probe-tip adaptor 302 and build-out adaptor 314 is for the signal path to have a specified controlled impedance (e.g. 50 Ohm controlled impedance), the path may partially exist through an impedance matched switch multiplexer (e.g. 50 Ohm switch multiplexer) and may thereby permit multiplex-ing more than one probe into one instrument channel (the build-out adaptor 314 may reside between the multiplexer output and the instrument input). Multiplexing of conven-tional probes is not possible because they are unable to compensate for the added capacitance of the multiplexer, nor adequately suppress reflections along the low-loss signal path section inside the multiplexer.

It should be noted that signal values, impedance values and connector types, among others, are given by way of example and should not be interpreted as being essential to the description provided herein.

Figure 4:
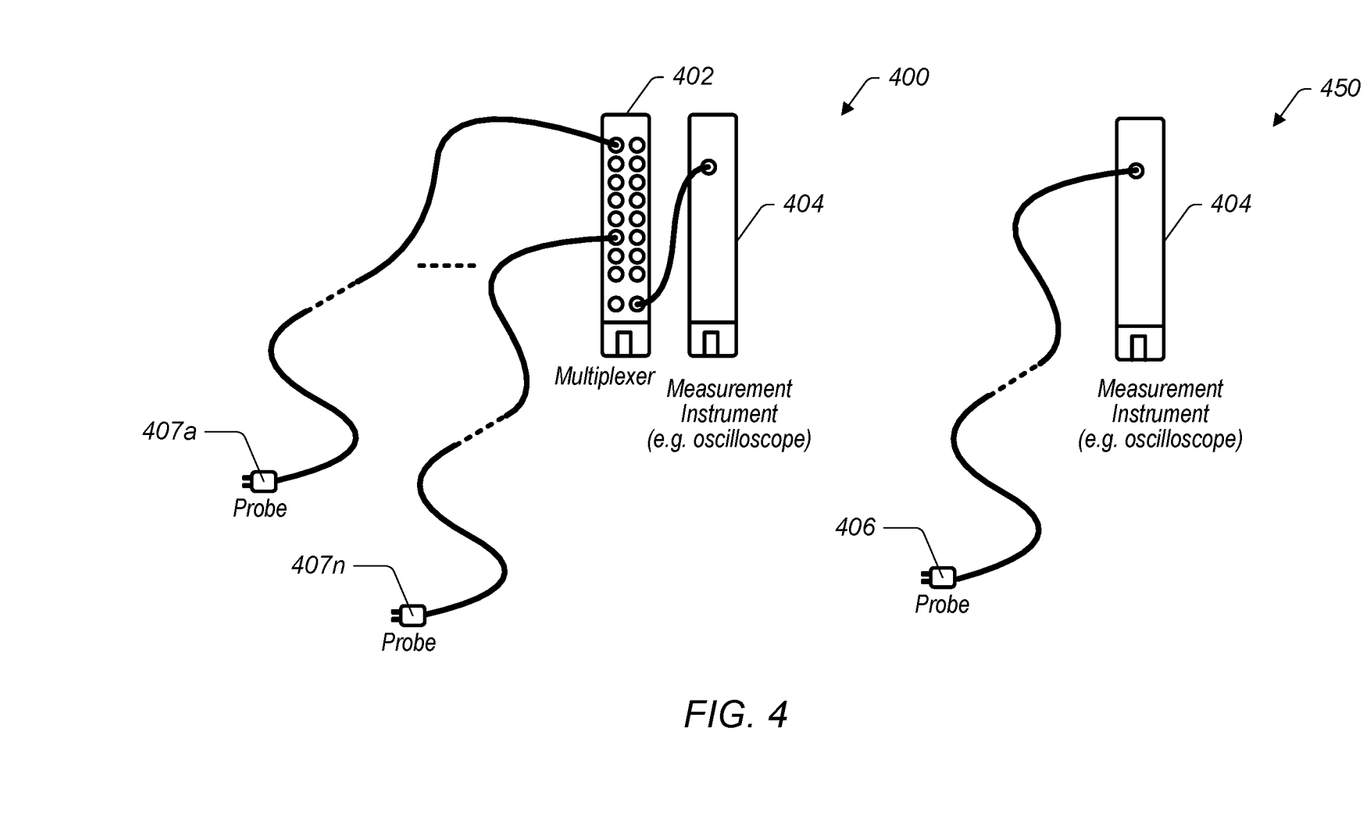
FIG. 4 shows a simplified diagram of exemplary measurement systems in which a modular probe is connected to a measurement instrument, according to some embodiments.

Further pursuant to the above, various measurement sys-tems, e.g. as illustrated in FIG. 4 may include a measurement instrument(s) and one or more modular probes according to various embodiments described herein. In some embodiments, e.g. as illustrated by system 450, the modular probe 406 may be coupled directly to the measurement instrument 404 (via the build-out adaptor 314) and to a DUT or test point on a DUT (not shown) via the probe-tip adaptor 302. In some embodiments, e.g. as illustrated in system 400, modular probes 407a to 407n may connect to a relay multiplexer 402, which itself may connect to a front-end of a channel of the instrument 404. The multiplexer 402 may selectively couple any one of probes 407a to 407n to the measurement instrument 404 at any one time. The modular probes 407a to 407n may be directly coupled to the multiplexer 402 via their respective the build-out adaptors 314 and each respective probe may be coupled to a corresponding DUT or corresponding test point on a DUT (not shown) via their respective probe-tip adaptors 302. As previously mentioned, a DUT may have multiple test points, in which case a different respective probe may be coupled to each test point on the DUT via the probe's respective probe-tip adaptor 302.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A modular probe comprising:
    a disconnectable probe-tip adaptor having a tip connector at one end and further having an assembly terminal at the other end, the tip connector configured to couple to a device under test;
    a disconnectable cable assembly having a first assembly connector at a first end of a cable and further having a second assembly connector at a second end of the cable, the first assembly connector coupled to the assembly terminal;
    a disconnectable build-out adaptor comprising a compensation circuit and having a first build-out terminal at one end and further having a second build-out terminal at the other end, the first build-out terminal coupled to the second assembly connector; and
    a disconnectable instrument connector cable assembly having a third assembly connector at one end and further having an instrument-end connector at the other end, the third assembly connector coupled to the second build-out terminal, wherein the instrument-end connector is configured to couple to a measurement instrument.

2. The modular probe of claim 1, wherein the disconnectable built-out adaptor further comprises:
    compensation adjustment control that enables the compensation circuit to adjustably compensate for respective capacitances of different cables having different lengths.

3. The modular probe of claim 2, wherein the compensation adjustment control further enables the compensation circuit to adjustably compensate for respective input capacitances of different measurement instruments coupled to the instrument-end connector.

4. The modular probe of claim 1, further comprising one or more corrective circuits included in the disconnectable probe-tip adaptor and configured to terminate the first end of the cable with a characteristic impedance of the cable to at least partially attenuate reflections in the cable assembly.

5. The modular probe of claim 1, wherein the cable comprises general purpose use coaxial cable.

6. The modular probe of claim 1, wherein one or more of the following comprise a coaxial connector:
    the first assembly connector;
    the second assembly connector; or
    the third assembly connector.

7. The modular probe of claim 1, wherein the tip connector comprises a standard coaxial connector.

8. The modular probe of claim 1, wherein the disconnectable probe-tip adaptor is connectively replaceable by a different probe-tip adaptor having a different attenuation level than the probe-tip adaptor.

9. The modular probe of claim 1, wherein the disconnectable instrument connector cable assembly is connectively replaceable by a different instrument connector cable assembly having a respective instrument-end connector compatible with a corresponding input terminal of the measurement instrument in case the instrument-end connector of the disconnectable instrument connector cable assembly is not compatible with the corresponding input terminal of the measurement instrument.

10. A measurement system for performing measurements on a device under test, the measurement system comprising:
    a device under test (DUT);
    a measurement instrument configured to perform measurement on the device under test; and
    a modular probe coupling the DUT to the measurement instrument, wherein the modular probe comprises:
        a disconnectable probe-tip adaptor having a tip connector at one end and further having an assembly terminal at the other end, the tip connector coupled to the DUT;
        a disconnectable cable assembly having a first assembly connector at a first end of a cable and further having a second assembly connector at a second end of the cable, the first assembly connector coupled to the assembly terminal;
        a disconnectable build-out adaptor comprising a compensation circuit and having a first build-out terminal at one end and further having a second build-out terminal at the other end, the first build-out terminal coupled to the second assembly connector; and
        a disconnectable instrument connector cable assembly having a third assembly connector at one end and further having an instrument-end connector at the other end, the third assembly connector coupled to the second build-out terminal, wherein the instrument-end connector is coupled to the measurement instrument.

11. The measurement system of claim 10, wherein the disconnectable built-out adaptor further comprises compensation adjustment control that enables the compensation circuit to adjustably compensate for respective capacitances of different cables having different lengths.

12. The measurement system of claim 11, wherein the compensation adjustment control further enables the compensation circuit to adjustably compensate for respective input capacitances of different measurement instruments coupled to the instrument-end connector.

13. The measurement system of claim 10, wherein the modular probe further comprises one or more corrective circuits included in the disconnectable probe-tip adaptor and configured to terminate the first end of the cable with a characteristic impedance of the cable to at least partially attenuate reflections in the cable assembly.

14. The measurement system of claim 10, wherein one or more of the following comprise a coaxial connector:
   the first assembly connector;
   the second assembly connector; or
   the third assembly connector.

15. The measurement system of claim 10, wherein the disconnectable probe-tip adaptor is connectively replaceable by a different probe-tip adaptor having a different attenuation level than the probe-tip adaptor.

16. The measurement system of claim 10, wherein the disconnectable instrument connector cable assembly is connectively replaceable by a different instrument connector cable assembly having a respective instrument-end connector compatible with a corresponding input terminal of the measurement instrument in case the instrument-end connector of the disconnectable instrument connector cable assembly is not compatible with the corresponding input terminal of the measurement instrument.

17. A measurement system for performing measurements on a plurality of test points, the measurement system comprising:
   a plurality of test points on one or more devices under test;
   a measurement instrument configured to perform measurements on the plurality of test points;
   a plurality of modular probes, wherein each modular probe corresponds to a different respective test point of the plurality of test points; and
   a multiplexer configured to selectively couple any one of the plurality of modular probes to the measurement instrument at any given time, wherein each modular probe of the plurality of modular probes comprises:
      a disconnectable probe-tip adaptor having a tip connector at one end and further having an assembly terminal at the other end, the tip connector coupled to the respective test point corresponding to the modular probe;
      a disconnectable cable assembly having a first assembly connector at a first end of a cable and further having a second assembly connector at a second end of the cable, the first assembly connector coupled to the assembly terminal;
      a disconnectable build-out adaptor comprising a compensation circuit and having a first build-out terminal at one end and further having a second build-out terminal at the other end, the first build-out terminal coupled to the second assembly connector; and
      a disconnectable instrument connector cable assembly having a third assembly connector at one end and further having an instrument-end connector at the other end, the third assembly connector coupled to the second build-out terminal, wherein the instrument-end connector is coupled to a corresponding respective input terminal of the multiplexer.

18. The measurement system of claim 17, wherein the disconnectable built-out adaptor further comprises compensation adjustment control that enables the compensation circuit to adjustably compensate for respective capacitances of different cables having different lengths.

19. The measurement system of claim 18, wherein the compensation adjustment control further enables the compensation circuit to adjustably compensate for respective input capacitances of different measurement instruments coupled to the instrument-end connector.

20. The measurement system of claim 17, wherein the modular probe further comprises one or more corrective circuits included in the disconnectable probe-tip adaptor and configured to terminate the first end of the cable with a characteristic impedance of the cable to at least partially attenuate reflections in the cable assembly.

* * * * *